United States Patent
Choi et al.

(10) Patent No.: US 11,348,956 B2
(45) Date of Patent: May 31, 2022

(54) MULTI-GATE LATERAL OVERFLOW INTEGRATION CAPACITOR SENSOR

(71) Applicant: OMNIVISION TECHNOLOGIES, INC., Santa Clara, CA (US)

(72) Inventors: Woon Il Choi, Sunnyvale, CA (US); Keiji Mabuchi, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 240 days.

(21) Appl. No.: 16/717,768

(22) Filed: Dec. 17, 2019

(65) Prior Publication Data

US 2021/0183926 A1 Jun. 17, 2021

(51) Int. Cl.
*H01L 27/146* (2006.01)
*H04N 5/378* (2011.01)
*H04N 5/355* (2011.01)

(52) U.S. Cl.
CPC .. *H01L 27/14616* (2013.01); *H01L 27/14641* (2013.01); *H01L 27/14643* (2013.01); *H04N 5/3559* (2013.01); *H04N 5/378* (2013.01)

(58) Field of Classification Search
CPC ......... H01L 27/14616; H01L 27/14643; H01L 27/14641; H04N 5/378; H04N 5/3559
See application file for complete search history.

(56) References Cited

U.S. PATENT DOCUMENTS

2011/0211103 A1\* 9/2011 Sakano .............. H04N 5/37452
348/308
2015/0124132 A1\* 5/2015 Mabuchi ............ H04N 5/35581
348/296

OTHER PUBLICATIONS

S. Iida et al., "A 0.68e-rms Random-Noise 121dB Dynamic-Range Sub-pixel architecture CMOS Image Sensor with LED Flicker Mitigation," Aug. 2018, 4 pages.

\* cited by examiner

*Primary Examiner* — Thanh Luu
(74) *Attorney, Agent, or Firm* — Perkins Coie LLP

(57) ABSTRACT

A pixel circuit includes a photodiode, a floating diffusion, and a conduction gate channel of a multi-gate transfer block disposed in a semiconductor material layer. The multi-gate transfer block is coupled to the photodiode, the floating diffusion, and an overflow capacitor. The multi-gate transfer block also includes first, second, and third gates that are disposed proximate to the single conduction gate channel region. The conduction gate channel is a single region shared among the first, second, and third gates. Overflow image charge generated in the photodiode leaks from the photodiode into the conduction gate channel to the overflow capacitor in response to the first gate, which is coupled between the photodiode and the conduction gate channel, receiving a first gate OFF signal and the second gate, which is coupled between the conduction gate channel and the overflow capacitor, receiving a second gate ON signal.

37 Claims, 9 Drawing Sheets

MULTI-GATE LATERAL OVERFLOW INTEGRATION CAPACITOR SENSOR

BACKGROUND INFORMATION

Field of the Disclosure

This disclosure relates generally to semiconductor devices, and in particular but not exclusively, relates to image sensors.

Background

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output signal from each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
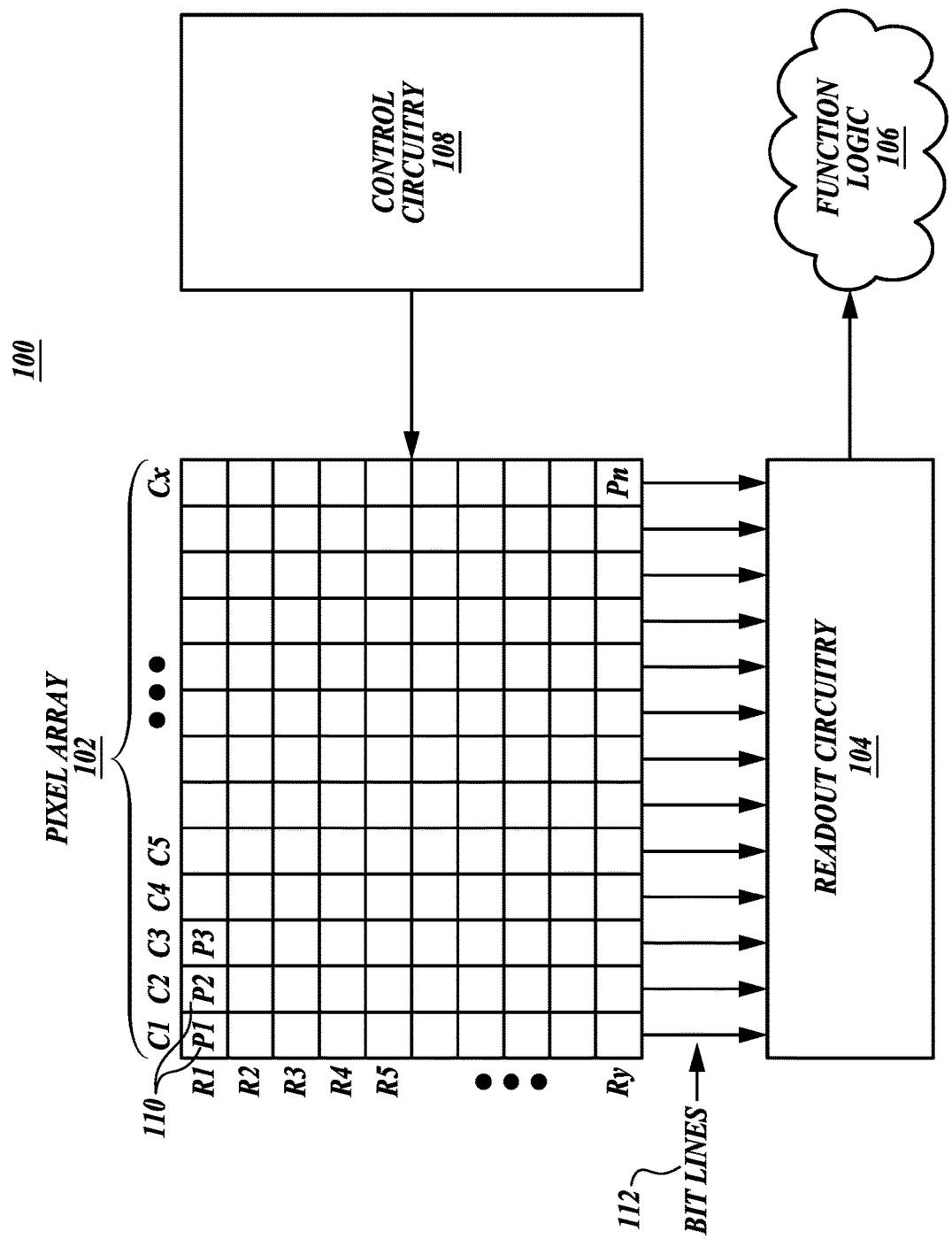
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to pixel circuits including a multi-gate overflow capacitor structures are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, in the various examples of the present disclosure, pixel circuits or image sensors including a multi-gate overflow capacitor structure are disclosed. For instance, in one example the multi-gate overflow capacitor structure may include a tri-gate charge transfer block that is coupled to a lateral overflow integration capacitor (LOFIC), a floating diffusion (FD), and a photodiode (PD) of a pixel circuit. In the example, the tri-gate charge transfer block includes a plurality of transfer gates including first gate (which is labeled "P" in the figures) that is coupled to the photodiode, a second gate (which is labeled "L" in figures) coupled to an overflow capacitor (e.g., LOFIC), and a third gate (which is labeled "F" in the figures) coupled to the floating diffusion. In the example, the first, second, and third gates are disposed proximate to a single conduction gate channel that is shared by the first, second, and third gates. The conduction gate channel is devoid of junctions so that there are no junctions in or between the first, second, and third gates. Therefore, there is no lag or fixed pattern noise (FPN) caused by operation of the tri-gate charge transfer block. The photodiode, overflow capacitor, and/or floating diffusion can be coupled to or decoupled from one another through the conduction gate-channel via charge coupling gate by gate through the tri-gate charge transfer block. Thus, charge flow between the first gate, the second gate, and/or the third gate can be controlled in response to respective gate control signals coupled to be received by each respective gate. Accordingly, it is appreciated that a multi-gate overflow capacitor structure such as a tri-gate charge transfer block coupled to an overflow capacitor (e.g., LOFIC) in accordance with the teachings of the present invention makes possible a very low noise high dynamic range (HDR) sensor without compromising between the photosensitive area and full well capacity (FWC) loss.

FIG. 1 illustrates one example of an imaging system 100 including image sensor pixels that include multi-gate overflow capacitor structures in accordance with an embodiment of the present disclosure. Imaging system 100 includes pixel array 102, control circuitry 108, readout circuitry 104, and function logic 106. In one example, pixel array 102 is a two-dimensional (2D) array of photodiodes, or image sensor pixels 110 (e.g., P1, P2, . . . , Pn) that include multi-gate overflow capacitor structures in accordance with the teachings of the present invention, which will be described in further detail below. As illustrated in the depicted example, pixels 110 are arranged in rows (e.g., rows Row 0 to Row M−1) and columns (e.g., column Col 0 to Col N−1) to acquire image data of a person, place, object, etc., which can then be used to render a 2D image of the person, place, object, etc. However, pixels 110 do not have to be arranged into rows and columns and may take other configurations.

In one example, after each image sensor photodiode/pixel 110 in pixel array 102 has acquired its image charge through photo-generation of the image charge, corresponding image data is read out by a readout circuit through bit lines 112 and then transferred to function logic 106. Readout circuitry 104 may be coupled to read out image data from the plurality of pixels 110 in pixel array 102. In various examples, the readout circuitry 104 may include amplification circuitry, analog-to-digital (ADC) conversion circuitry, or otherwise. In one example, the readout circuitry 104 may read out a row of image data at a time along bit lines 112 as illustrated in FIG. 1. The function logic 106 may store the image data or even manipulate the image data by applying post image effects (e.g., crop, rotate, remove red eye, adjust brightness, adjust contrast, or otherwise).

Figure 2A:
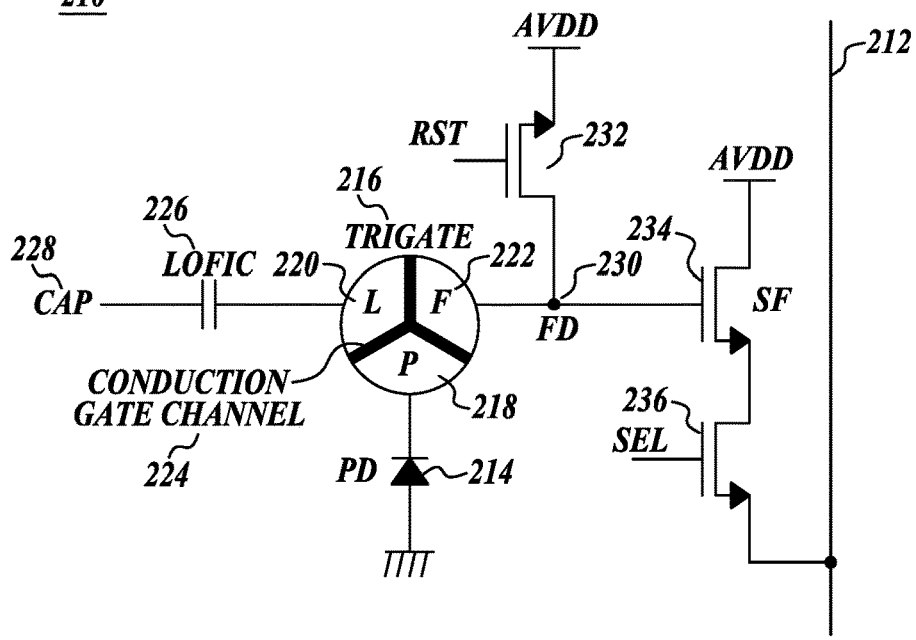
FIG. 2A is a schematic that shows one example of a pixel circuit including an example of a multi-gate overflow capacitor structure in accordance with the teachings of the present disclosure.
Figure 2B:
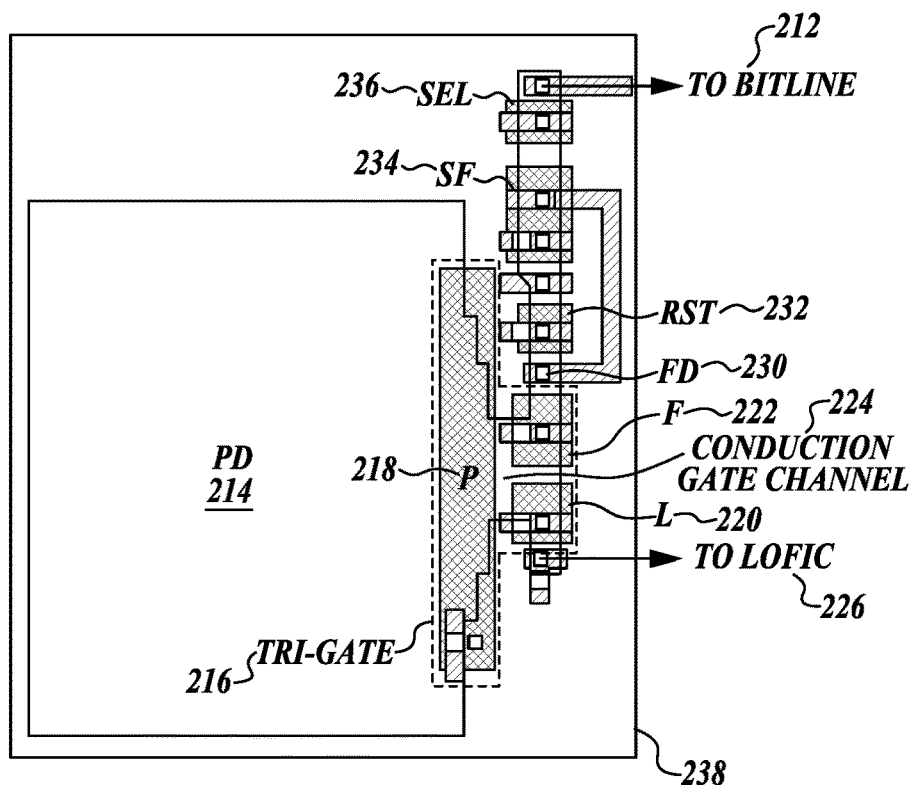
FIG. 2B is a top down view of one example of a pixel circuit including an example of a multi-gate overflow capacitor structure in accordance with the teachings of the present disclosure.

FIG. 2A is a schematic that shows one example of a pixel circuit 210 including an example of a multi-gate overflow capacitor structure in accordance with the teachings of the present disclosure. FIG. 2B is a top down view of one example of pixel circuit 210 including an example of a multi-gate overflow capacitor structure in accordance with the teachings of the present disclosure. It is appreciated the pixel circuit 210 of FIGS. 2A-2B may be an example of a pixel 110 of the image sensor 100 as shown in FIG. 1, and that similarly named and numbered elements described above are coupled and function similarly below. As shown in the examples depicted in FIGS. 2A-2B, pixel circuit 210 includes a photodiode 214 and a floating diffusion 230 disposed in a semiconductor material layer 238. In the illustrated example, a multi-gate transfer block 216 is coupled to the photodiode 214, the floating diffusion 230, and an overflow capacitor 226.

In the depicted example, the overflow capacitor 226 is a lateral overflow integration capacitor (LOFIC). As such, the overflow capacitor 226 is also labeled "LOFIC" in the examples depicted in the drawings in the present disclosure. In various examples, the overflow capacitor may be implemented with a metal-insulator-metal (MIM), a metal oxide semiconductor capacitor (MOSCAP), or another suitable overflow capacitor structure. As shown in the depicted example, the overflow capacitor 226 has a first end that is coupled to the L gate 220 of multi-gate transfer block 216, and a second end that is coupled to receive a capacitor signal (CAP) 228.

As illustrated in the depicted example, a reset transistor 232 is coupled between a voltage supply (e.g., AVDD) and the floating diffusion 230. A gate of a source follower transistor 234 is coupled to the floating diffusion 230. The drain of the source follower transistor 234 is coupled to a voltage supply (e.g., AVDD). A row select transistor 236 is coupled to a source of the source follower transistor 234. In operation, the row select transistor is coupled to output an image data signal from pixel circuit 210 to a bitline 212 in response to a select signal SEL.

In the depicted example, the multi-gate transfer block 216 includes three transfer gates 218, 220, 222, and a conduction gate channel 224. As such, multi-gate transfer block 216 may also referred to in this disclosure as a tri-gate transfer block 216 as labeled in the example drawings of the present disclosure. In the depicted example, a first gate 218 of tri-gate transfer block 216 is coupled to photodiode 214. As such, first gate 218 may also be referred in this disclosure as a P gate 218 as labeled in the example drawings. The P gate 218 is coupled between the photodiode 214 and the conduction gate channel 224. In the depicted example, a second gate 220 of tri-gate transfer block 216 is coupled to the overflow transistor (LOFIC) 226. As such, second gate 220 may also be referred in this disclosure as an L gate 220 as labeled in the example drawings. The L gate 220 is coupled between the overflow capacitor 228 and the conduction gate channel 224. In the depicted example, a third gate 222 of tri-gate transfer block 216 is coupled to the floating diffusion 230. As such, third gate 222 may also be referred in this disclosure as an F gate 222 as labeled in the example drawings. The F gate 222 is coupled between the floating diffusion 230 and the conduction gate channel 224.

In the depicted example, the P gate 218, L gate 220, and F gate 222 are disposed proximate to a conduction gate channel region 224 disposed in the semiconductor material layer 238. In the example, the conduction gate channel 224 is a single region that is shared among the P gate 218, L gate 220, and F gate 222. It is appreciated that the conduction gate channel 224 is represented in FIG. 2A as the three-sided "star" shaped region between the P gate 218, the L gate 220, and the F gate 222 in tri-gate transfer block 216, and that the conduction gate channel 224 is represented in FIG. 2B as the "sideways-T" shaped region between the P gate 218, the L gate 220, and the F gate 222 in tri-gate transfer block 216. In the example, the conduction gate channel 224 is devoid of any junctions in or between the P gate 218, L gate 220, and F gate 222, which means no charge remains between the P gate 218, the L gate 220, and the F gate 222 during operation of tri-gate transfer block 216. As such, there is very little or no fixed pattern noise (FPN) during operation. The photodiode 214, the overflow capacitor 226, and the floating diffusion 230 may be configured to be selectively coupled together through the tri-gate transfer block 216 via charge coupling among the P gate 218, L gate 220, and F gate 222 through the conduction gate channel 224.

Figure 3A:
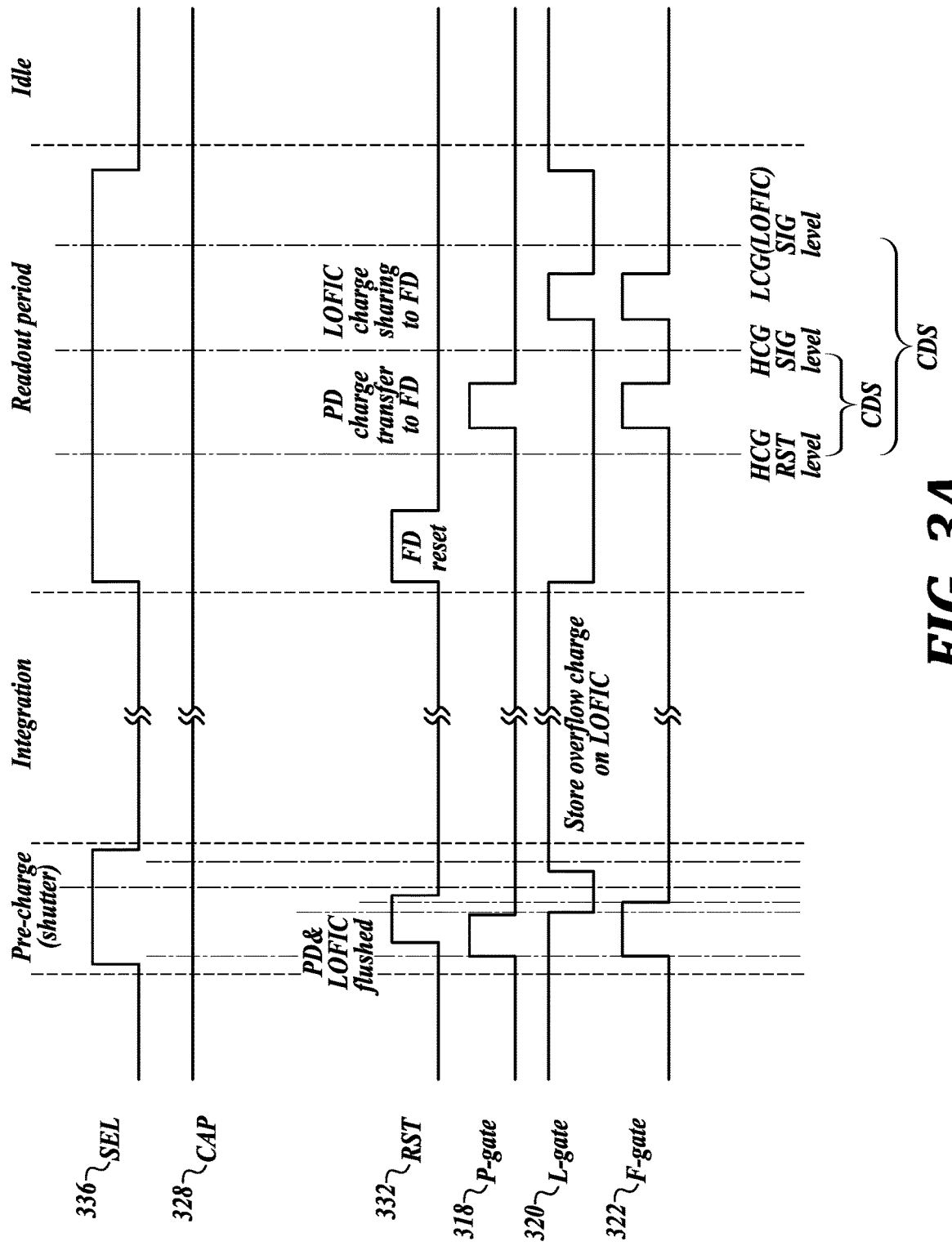
FIGS. 3A-3B are example timing diagrams that illustrate operation of an example pixel circuit including examples of multi-gate overflow capacitor structures in accordance with the teachings of the present disclosure.
Figure 3B:
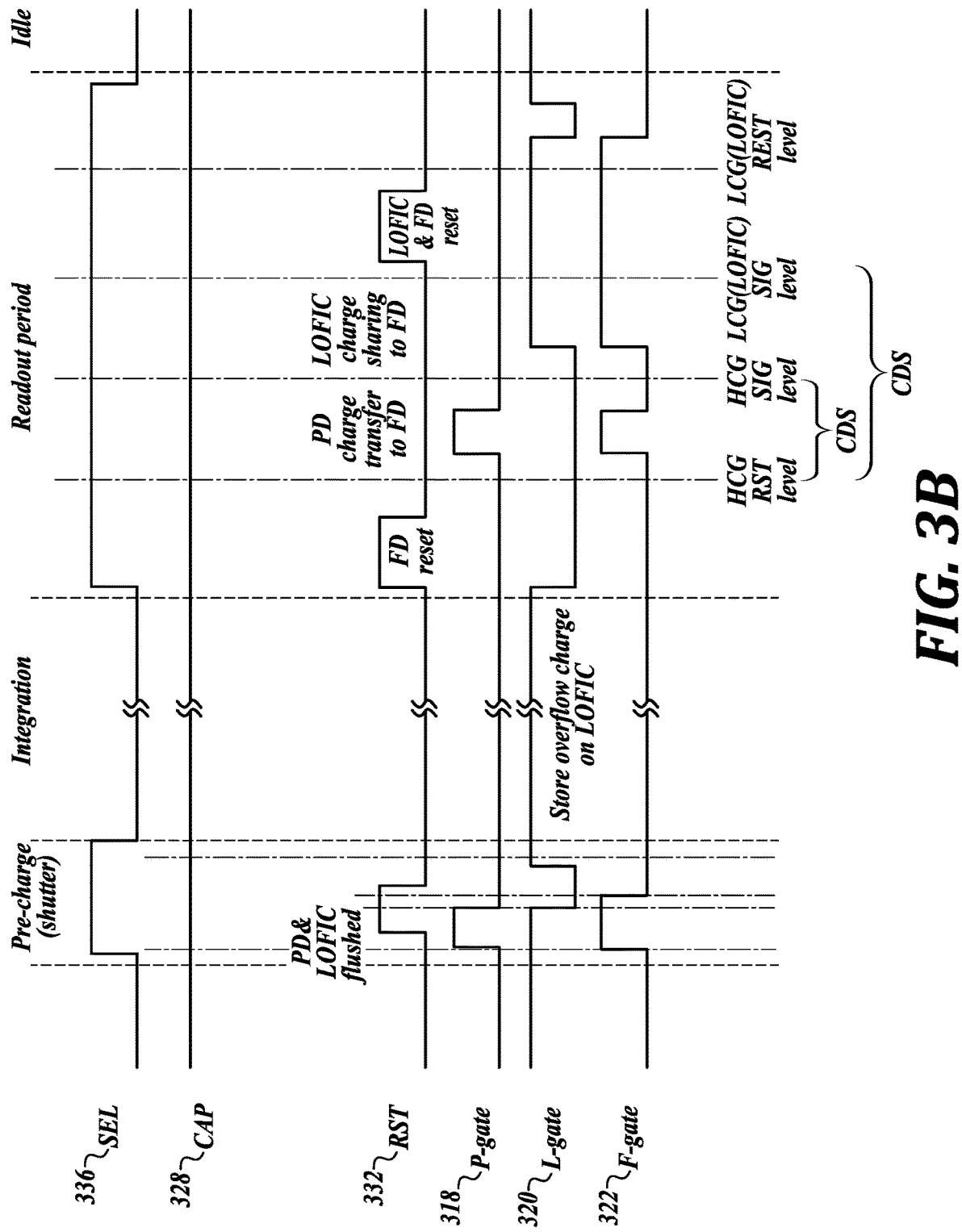

FIGS. 3A-3B are example timing diagrams that illustrate operation of an example pixel circuit including examples of multi-gate overflow capacitor structures in accordance with the teachings of the present disclosure. It is appreciated the example timing diagrams shown of FIGS. 3A-3B may illustrate examples of signals found in the example pixel circuit 210 of shown in FIGS. 2A-2B, and that similarly named and numbered elements described above are coupled and function similarly below. As shown in the example depicted in FIG. 3A, processing may begin with a pre-charge (shutter) period, which may occur for instance to initialize the pixel cell prior to an integration period. During the pre-charge period, the select signal 336, the reset signal 332, the P gate signal 318, the L gate signal 320, and the F gate signal 322 all receive ON pulses as shown, which flush the photodiode 214 and the overflow capacitor (LOFIC) 226 of charge. It is noted that the capacitor signal (CAP) 328 remains at a pulse ON level throughout the timing diagrams shown in FIGS. 3A-3B.

After the pre-charge period, an integration period may occur during which image charge is generated in the photodiode 214 in response to incident light. As shown in the example depicted in FIG. 3A, the select signal 336, the reset signal 332, the P gate signal 318, and the F gate signal 322 are all coupled to receive OFF pulses and the L gate signal 320 is coupled to receive an ON pulse as shown. During the integration period, the excess or overflow image charge that is generated in the photodiode 214 that is generated in response to the incident light is configured to leak from the photodiode 214 into the conduction gate channel 224 and be transferred to the overflow capacitor 226.

After the integration period, the readout period begins with the floating diffusion 230 being coupled to be reset to flush out undesired charge in the floating diffusion 230 in response to the select signal 336 and the reset signal 332 receiving ON pulses, and the P gate signal 318, the L gate signal 3320, and the F gate signal 322 receiving OFF pulses as shown. It is appreciated that the floating diffusion 230 is reset to a reset level without affecting the overflow charge in the overflow capacitor 226. After the floating diffusion 230 is reset, the floating diffusion reset level may be read out through the source follower transistor 234 and the row select transistor 236 to provide a high conversion gain (HCG) reset level for correlated double sampling (CDS) determination.

Next, the image charge generated in the photodiode 214 in response to the incident light is configured to be transferred from the photodiode 214 into the conduction gate channel 224 and be transferred to the floating diffusion 230 in response to the select signal 336, the P gate signal 318, and the F gate signal 322 receiving ON pulses, and the reset signal 332 and the L gate signal 320 receiving OFF pulses as shown. It is appreciated that the overflow charge remains isolated in the overflow capacitor 226 during this operation with the L gate signal 320 receiving the OFF pulse. After the image charge is transferred to the floating diffusion 230, the HCG signal level may be read out through the source follower transistor 234 and the row select transistor 236 for correlated double sampling (CDS) determination.

Next, the overflow image charge in the overflow capacitor 226 and the image charge in the floating diffusion 230 are configured to be shared to the source follower transistor 234 in response to the select signal 336, the L gate signal 320, and the F gate signal 322 receiving ON pulses, and the reset signal 332 and the P gate signal 318 receiving OFF pulses as shown. After the overflow image charge from overflow capacitor 226 and the image charge in the floating diffusion 230 are shared to the source follower transistor 234, the low conversion gain (LCG) (e.g., including LOFIC overflow image charge) signal level may be read out through the source follower transistor 234 and the row select transistor 236 in response to the select signal 336 receiving the ON pulse, and the reset signal 332, the P gate signal 318, the L gate signal 320, and the F gate signal 322 receiving OFF pulses as shown for correlated double sampling (CDS) determination.

After the readout period, the row including pixel circuit 210 begins an idle period as shown in the timing diagrams. As can be appreciated, very low noise correlated double sampling (CDS) signals can be obtained with pixel circuit 210 without the overflow image charges loss from overflow capacitor 226 by using tri-gate charge transfer block 216 as disclosed in accordance with the teachings of the present invention.

The timing diagram shown in FIG. 3B provides another pixel circuit 210 timing example in accordance with the teachings of the present invention. It is appreciated that the example shown in FIG. 3B shares many similarities with the timing diagram illustration of FIG. 3A, which will not be described in detail again for the sake of brevity. One of the differences is shown in FIG. 3B occurs during the readout period after the overflow image charge from the overflow capacitor 226 and the image charge in the floating diffusion 230 are configured to be shared to the source follower transistor 234. In the timing diagram example shown in FIG. 3B, the low conversion gain (LCG) (e.g., including LOFIC overflow image charge) signal level may be read out through the source follower transistor 234 and the row select transistor 236 in response to the select signal 336, the L gate signal 320, and the F gate signal 322 receiving the ON pulse, and the reset signal 332 and the P gate signal 318 receiving OFF pulses as shown for correlated double sampling (CDS) determination.

Next, after the LCG (LOFIC) signal level is determined, the overflow capacitor 226 and floating diffusion 230 may be reset in response to the select signal 336, the reset signal 332, the L gate signal 320, and the F gate signal 322 receiving the ON pulse, and the P gate signal 318 receiving an OFF pulse as shown. After the overflow capacitor 226 and floating diffusion 230 are reset, the low conversion gain (LCG) (e.g., including LOFIC overflow image charge) reset level may be read out through the source follower transistor 234 and the row select transistor 236 in response to the select signal 336, the L gate signal 320, and the F gate signal 322 receiving the ON pulse, and the reset signal 332 and the P gate signal 318 receiving the OFF pulse as shown. After the readout period, the row including pixel circuit 210 begins an idle period as shown in the timing diagrams.

Figure 4A:
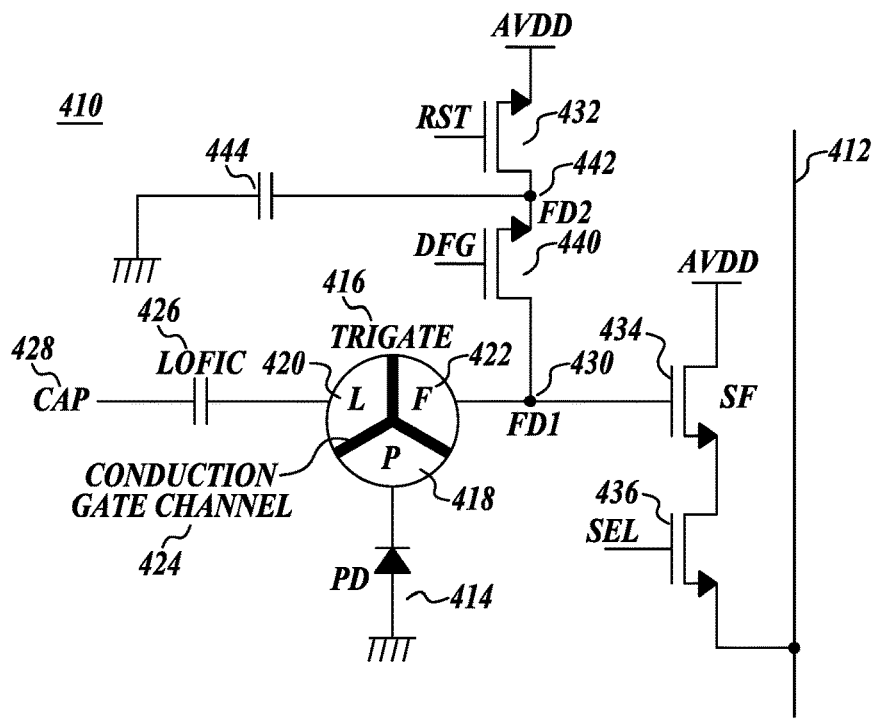
FIG. 4A is a schematic that shows another example of a pixel circuit including an example of a multi-gate overflow capacitor structure in accordance with the teachings of the present disclosure.
Figure 4B:
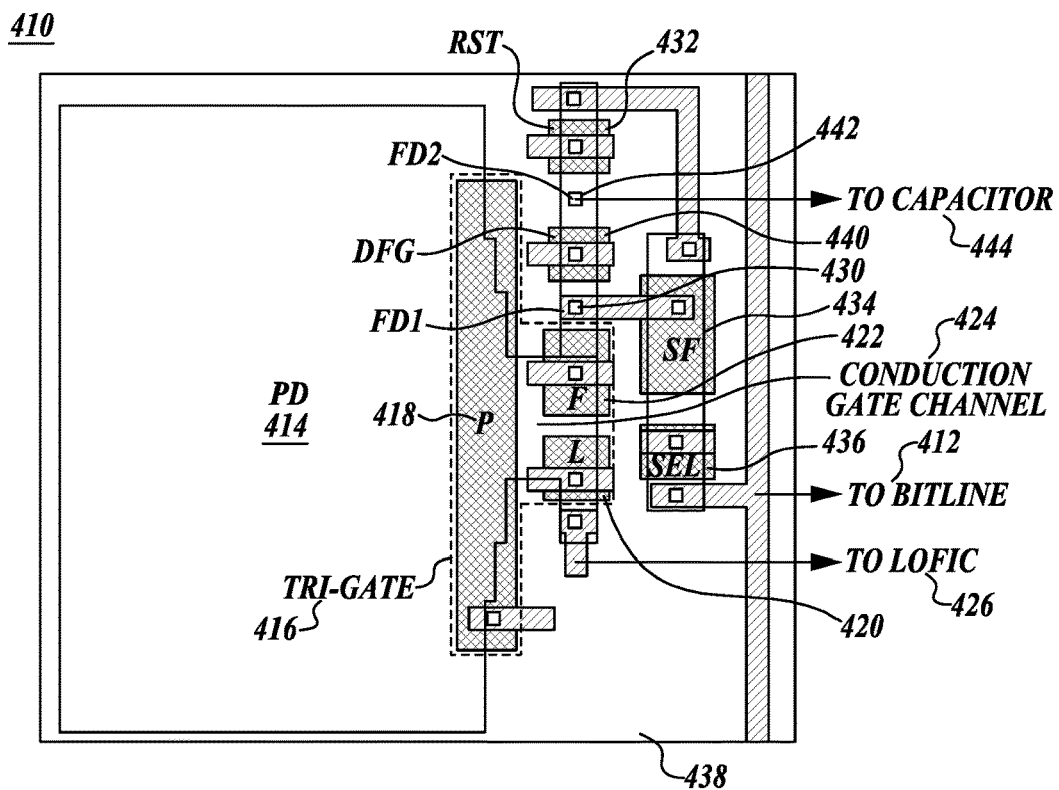
FIG. 4B is a top down view of another example of a pixel circuit including an example of a multi-gate overflow capacitor structure in accordance with the teachings of the present disclosure.

FIG. 4A is a schematic that shows another example of a pixel circuit 410 including an example of a multi-gate overflow capacitor structure in accordance with the teachings of the present disclosure. FIG. 4B is a top down view of another example of a pixel circuit 410 including an example of a multi-gate overflow capacitor structure in accordance with the teachings of the present disclosure. It is appreciated the pixel circuit 410 of FIGS. 4A-4B may be an example of a pixel 110 of the image sensor 100 as shown in FIG. 1 and/or pixel circuit 210 as shown in FIGS. 2A-2B, and that similarly named and numbered elements described above are coupled and function similarly below. It is appreciated that the examples shown in FIGS. 4A-4B share many similarities with the examples shown in FIGS. 2A-2B, which will not be described in detail again for the sake of brevity.

The differences between example pixel circuit 410 of FIGS. 4A-4B and example pixel 210 of FIGS. 2A-2B is that pixel circuit 410 of FIGS. 4A-4B include a second floating diffusion (FD2) 442 disposed in the semiconductor material layer 438 and coupled between the reset transistor 432 and the first floating diffusion. A second capacitor 444 is coupled to the second floating diffusion 442, and a dual floating diffusion gate (DFG) transistor 440 is coupled between the second floating diffusion 442 and the first floating diffusion 430.

FIGS. 5A-5D are additional example timing diagrams that illustrate operation of an example pixel circuit including an example of a multi-gate overflow capacitor structure in accordance with the teachings of the present disclosure. It is appreciated the example timing diagrams shown of FIGS. 5A-5D may illustrate examples of signals found in the example pixel circuit 410 of shown in FIGS. 4A-4B, and that similarly named and numbered elements described above are coupled and function similarly below. As shown in the example depicted in FIG. 5A, processing may begin with a pre-charge (shutter) period, which may occur for instance to initialize the pixel cell prior to an integration period. During the pre-charge period, the select signal 536, the reset signal 532, the dual floating diffusion gate (DFG) signal 540, the P gate signal 518, the L gate signal 520, and the F gate signal 522 all receive ON pulses as shown, which flush the photodiode 414 and the overflow capacitor (e.g., LOFIC) 426 of charge. It is noted that the capacitor signal (CAP) 528 remains at a pulse ON potential level throughout the timing diagram shown of FIG. 5A.

After the pre-charge period, an integration period may occur during which image charge is generated in the photodiode 414 in response to incident light. As shown in the example depicted in FIG. 5A, the select signal 536, the reset signal 532, the P gate signal 518, and the F gate signal 522 are all coupled to receive OFF pulses, and the DFG signal 540 and the L gate signal 520 are coupled to receive an ON pulse as shown. During the integration period, the excess or overflow image charge that is generated in the photodiode 414 that is generated in response to the incident light is configured to leak from the photodiode 414 into the conduction gate channel 424 and be transferred to the overflow capacitor 426.

After the integration period, the readout period begins with the first floating diffusion 430 and the second floating diffusion 442 being coupled to be reset to flush out undesired charge in response to the P gate signal 518, the L gate signal 520, and the F gate signal 522 being coupled to receive OFF pulses, and the select signal 536, the reset signal 532, and the DFG signal 540 being coupled to receive ON pulses as shown. It is appreciated that the first floating diffusion 430 and the second floating diffusion 442 are reset to the reset level without affecting the overflow charge in the overflow capacitor 426.

After the first floating diffusion 430 and the second floating diffusion 442 are reset, the reset level from the first floating diffusion 430 and the second floating diffusion 442 may be read out through the source follower transistor 434 and the row select transistor 436 in response to the reset signal 532, the P gate signal 518, the L gate signal 520, and the F gate signal 522 being coupled to receive OFF pulses, and the select signal 536 and the DFG signal 540 being coupled to receive ON pulses to provide a medium conversion gain (MCG) reset level for correlated double sampling (CDS) determination as shown.

Next, as shown in the depicted example, a high conversion gain (HCG) reset level may be read out for correlated double sampling (CDS) determination in response to the reset signal 532, the DFG signal 540, the P gate signal 518, the L gate signal 520, and the F gate signal 522 being coupled to receive OFF pulses, and the select signal 536 being coupled to receive the ON pulse as shown.

Then, the image charge is transferred to the first floating diffusion 430 from the photodiode 414 in response to the reset signal 532, the DFG signal 540, and the L gate signal 520 being coupled to receive OFF pulses, and the select signal 536, the P gate signal 518, and the F gate signal 522 being coupled to receive ON pulses as shown. It is appreciated that the image charge from the photodiode 414 is transferred to the first floating diffusion 430 through the P gate 418 and the F gate 422 without flowing to the overflow capacitor 426.

Next, a high conversion gain (HCG) signal level may be read out for correlated double sampling (CDS) determination in response to the reset signal 532, the DFG signal 540, the P gate signal 518, the L gate signal 520, and the F gate signal 522 being coupled to receive OFF pulses, and the select signal 536 being coupled to receive the ON pulse as shown.

Then, additional image charge from the photodiode 414 is transferred to both the first floating diffusion 430 and the second floating diffusion 442 in response to the reset signal 532 and the L gate signal 520 being coupled to receive OFF pulses, and the select signal 536, the DFG signal 540, the P gate signal 518, and the F gate signal 522 being coupled to receive ON pulses as shown. It is appreciated that the image charge from the photodiode 414 is transferred to the first floating diffusion 430 and the second floating diffusion 442 through the P gate 418, the F gate 422, and the DFG transistor 440 without flowing to the overflow capacitor 426.

Next, a medium conversion gain (MCG) signal level (e.g., including image charge read out from both the first floating diffusion 430 and the second floating diffusion 442) may be read out for correlated double sampling (CDS) determination in response to the reset signal 532, the P gate signal 518, the L gate signal 520, and the F gate signal 522 being coupled to receive OFF pulses, and the select signal 536 and the DFG signal 540 being coupled to receive the ON pulses as shown.

Then, the overflow image charge in the overflow capacitor 426 may be dumped into the first floating diffusion 430 and the second floating diffusion 442 in response to the reset signal 532 and the P gate signal 518 being coupled to receive OFF pulses, and the select signal 536, the DFG signal 540, the L gate signal 520, and the F gate signal 522 being coupled to receive the ON pulses as shown.

Next, a low conversion gain (LCG) signal level (e.g., including charge read out from the overflow capacitor 426, the first floating diffusion 430, and the second floating diffusion 442) may be read out in response to the reset signal 532 and the P gate signal 518 being coupled to receive OFF pulses, and the select signal 536, the DFG signal 540, the L gate signal 520, and the F gate signal 522 being coupled to receive the ON pulses as shown.

Then, the overflow capacitor 426, the first floating diffusion 430, and the second floating diffusion 442 are all coupled to be reset to flush out charge in response to the select signal 536, the reset signal 532, the DFG signal 540, the P gate signal 518, the L gate signal 520, and the F gate signal 522 all being coupled to receive ON pulses as shown. Thus, it is appreciated that all image charge is drained from the pixel circuit 410 via the DFG transistor 440 and the reset transistor 432 as a result.

Next, a low conversion gain (LCG) reset level may then be read out in response to the reset signal 532 and the P gate signal 518 being coupled to receive OFF pulses, and the select signal 536, the DFG signal 540, the L gate signal 520, and the F gate signal 522 being coupled to receive the ON pulses as shown.

After the readout period, the row including pixel circuit 410 begins an idle period as shown in the timing diagrams.

It is noted that during the integration time, image sensors that include an overflow capacitor (e.g., 426) may suffer from a significant disadvantage of dark current from overflow capacitor electrode junctions that are held at a high voltage, such as for example at a reset voltage level approximately equal to a supply voltage of AVDD. In the example timing diagram depicted in FIG. 5B, the potential of overflow capacitor 426 electrodes is modulated with appropriate capacitor signal (CAP) 528 pulsing to mitigate this concern. As will be shown the depicted example, low conversion gain (LCG) is used when reading out the photodiode 414 and overflow capacitor 426 charge values. In addition, it is appreciated that higher modulated potential levels for the capacitor signal (CAP) 528 are referred to as pulse ON signals, while lower modulated potential values for the capacitor signal (CAP) 528 are referred to as pulse OFF signals.

Figure 5A:
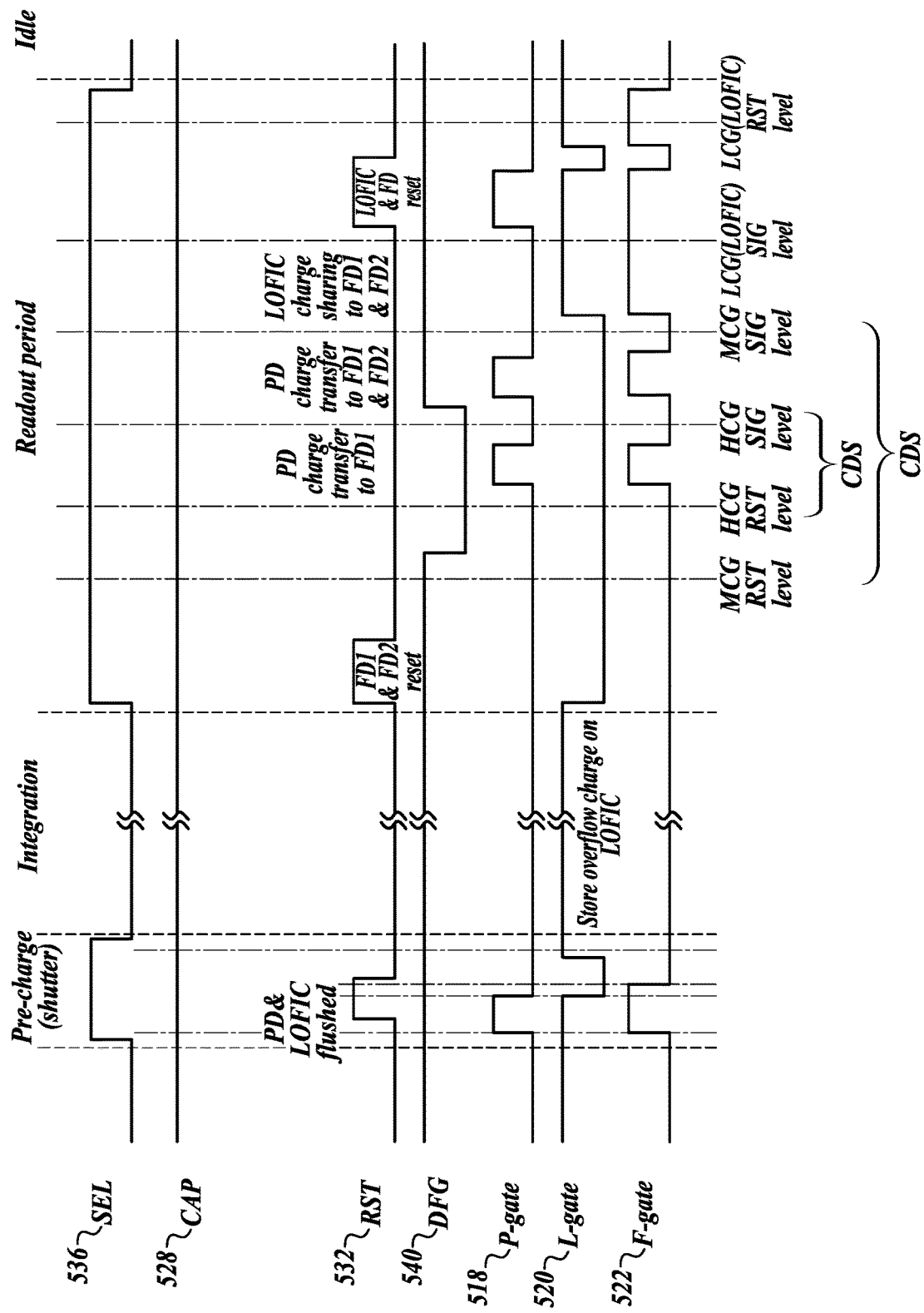
FIGS. 5A-5D are additional example timing diagrams that illustrate operation of an example pixel circuit including an example of a multi-gate overflow capacitor structure in accordance with the teachings of the present disclosure.
Figure 5B:
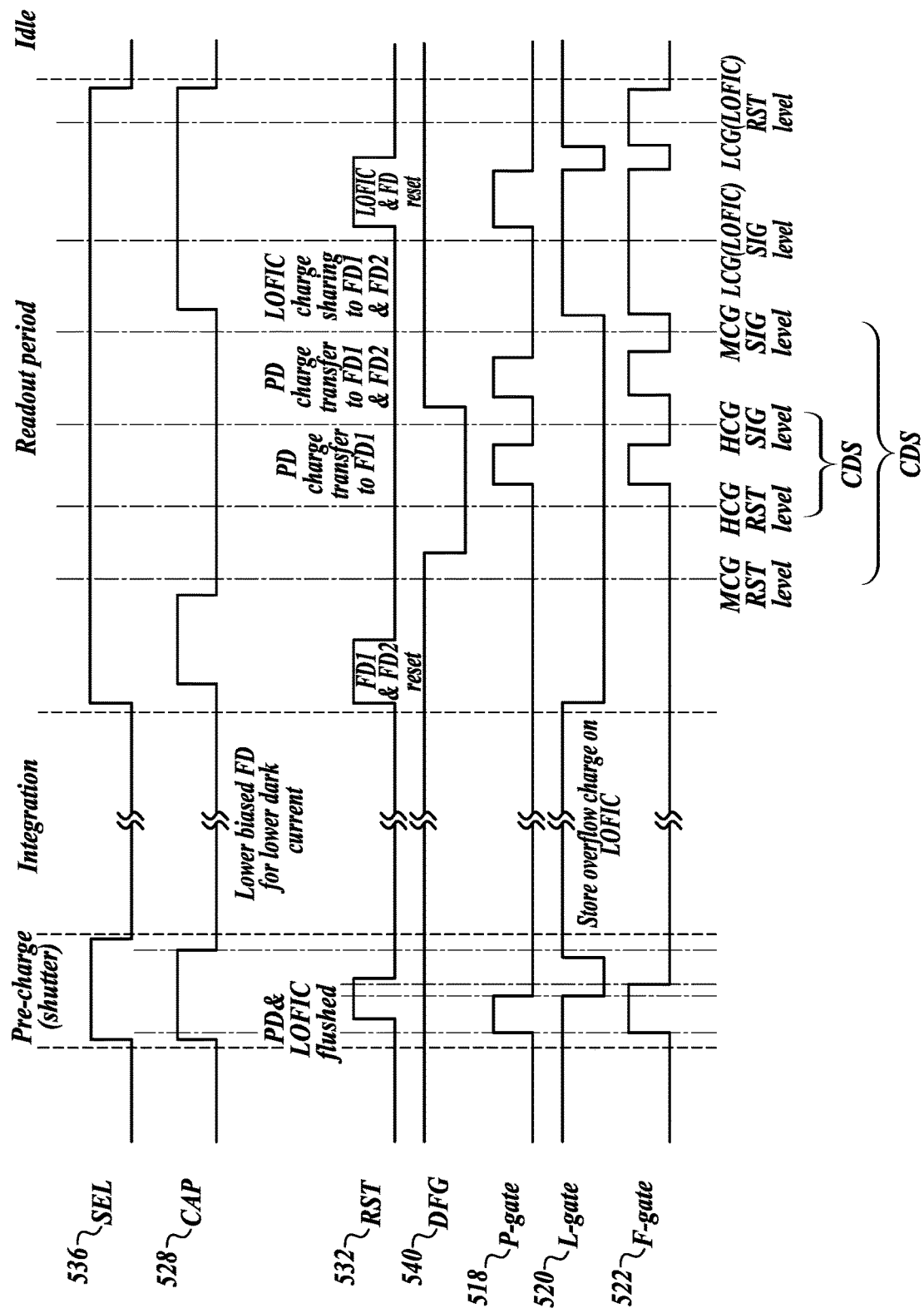

As shown in the example depicted in FIG. 5B, processing may begin with a pre-charge (shutter) period, which may occur for instance to initialize the pixel cell prior to an integration period. During the pre-charge period, the select signal 536, the reset signal 532, the dual floating diffusion gate (DFG) signal 540, the P gate signal 518, the L gate signal 520, and the F gate signal 522 all receive ON pulses and the capacitor signal 528 receives a pulse ON signal as shown, which flush the photodiode 414 and the overflow capacitor (LOFIC) 426 of charge.

After the pre-charge period, an integration period may occur during which image charge is generated in the photodiode 414 in response to incident light. As shown in the example depicted in FIG. 5B, the select signal 536, the reset signal 532, the P gate signal 518, and the F gate signal 322 are all coupled to receive OFF pulses, the capacitor signal 528 receives a pulse OFF signal, and the DFG signal 540 and the L gate signal 520 are coupled to receive an ON pulse as shown. During the integration period, the excess or overflow image charge that is generated in the photodiode 414 that is generated in response to the incident light is configured to leak from the photodiode 414 into the conduction gate channel 424 and be transferred to the overflow capacitor 426.

After the integration period, the readout period begins with the first floating diffusion 430 and the second floating diffusion 442 being coupled to be reset to flush out undesired charge in response to the P gate signal 518, the L gate signal 520, and the F gate signal 522 being coupled to receive OFF pulses, the select signal 536, the reset signal 532, and the DFG signal 540 being coupled to receive ON pulses, and the capacitor signal 528 receiving the pulse ON signal as shown. It is appreciated that the first floating diffusion 430 and the second floating diffusion 442 are reset to the reset level without affecting the overflow charge in the overflow capacitor 426.

After the first floating diffusion 430 and the second floating diffusion 442 are reset, the reset level from the first floating diffusion 430 and the second floating diffusion 442 may be read out through the source follower transistor 434 and the row select transistor 436 in response to the reset signal 532, the P gate signal 518, the L gate signal 520, and the F gate signal 522 being coupled to receive OFF pulses, the capacitor signal 528 receiving a pulse OFF signal, and the select signal 536 and the DFG signal 540 being coupled to receive ON pulses to provide a medium conversion gain (MCG) reset level for correlated double sampling (CDS) determination as shown.

Next, as shown in the depicted example, a high conversion gain (HCG) reset level may be read out for correlated double sampling (CDS) determination in response to the reset signal 532, the DFG signal 540, the P gate signal 518, the L gate signal 520, and the F gate signal 522 being coupled to receive OFF pulses, the capacitor signal 528 receiving a pulse OFF signal, and the select signal 536 being coupled to receive the ON pulse as shown.

Then, the image charge is transferred to the first floating diffusion 430 from the photodiode 414 in response to the reset signal 532, the DFG signal 540, and the L gate signal 520 being coupled to receive OFF pulses, the capacitor signal 528 receiving a pulse OFF signal, and the select signal 536, the P gate signal 518, and the F gate signal 522 being coupled to receive ON pulses as shown. It is appreciated that the image charge from the photodiode 414 is transferred to the first floating diffusion 430 through the P gate 418 and the F gate 422 without flowing to the overflow capacitor 426.

Next, a high conversion gain (HCG) signal level may be read out for correlated double sampling (CDS) determination in response to the reset signal 532, the DFG signal 540, the P gate signal 518, the L gate signal 520, and the F gate signal 522 being coupled to receive OFF pulses, the capacitor signal 528 receiving a pulse OFF signal, and the select signal 536 being coupled to receive the ON pulse as shown.

Then, additional image charge from the photodiode 414 is transferred to both the first floating diffusion 430 and the second floating diffusion 442 in response to the reset signal 532 and the L gate signal 520 being coupled to receive OFF pulses, the capacitor signal 528 receiving a pulse OFF signal, and the select signal 536, the DFG signal 540, the P gate signal 518, and the F gate signal 522 being coupled to receive ON pulses as shown. It is appreciated that the image charge from the photodiode 414 is transferred to the first floating diffusion 430 and the second floating diffusion 442 through the P gate 418, the F gate 422, and the DFG transistor 440 without flowing to the overflow capacitor 426.

Next, a medium conversion gain (MCG) signal level (e.g., including charge read out from both the first floating diffusion 430 and the second floating diffusion 442) may be read out for correlated double sampling (CDS) determination in response to the reset signal 532, the P gate signal 518, the L gate signal 520, and the F gate signal 522 being coupled to receive OFF pulses, the capacitor signal 528 receives a pulse OFF signal, and the select signal 536 and the DFG signal 540 being coupled to receive the ON pulses as shown.

Then, the overflow image charge in the overflow capacitor 426 may be dumped into the first floating diffusion 430 and the second floating diffusion 442 in response to the reset signal 532 and the P gate signal 518 being coupled to receive OFF pulses, the capacitor signal 528 receives a pulse ON signal, and the select signal 536, the DFG signal 540, the L gate signal 520, and the F gate signal 522 being coupled to receive the ON pulses as shown.

Next, a low conversion gain (LCG) signal level (e.g., including charge read out from the overflow capacitor 426, the first floating diffusion 430, and the second floating diffusion 442) may be read out in response to the reset signal 532 and the P gate signal 518 being coupled to receive OFF pulses, the capacitor signal 528 receives a pulse ON signal, and the select signal 536, the DFG signal 540, the L gate signal 520, and the F gate signal 522 being coupled to receive the ON pulses as shown.

Then, the overflow capacitor 426, the first floating diffusion 430, and the second floating diffusion 442 are all coupled to be reset to flush out charge in response to the select signal 536, the reset signal 532, the DFG signal 540, the P gate signal 518, the L gate signal 520, and the F gate signal 522 all being coupled to receive ON pulses and the capacitor signal 528 receives a pulse ON signal, as shown. Thus, it is appreciated that all image charge is drained from the pixel circuit 410 via the DFG transistor 440 and the reset transistor 432 as a result.

Next, a low conversion gain (LCG) reset level may then be read out in response to the reset signal 532 and the P gate signal 518 being coupled to receive OFF pulses, the capacitor signal 528 receives a pulse ON signal, and the select signal 536, the DFG signal 540, the L gate signal 520, and the F gate signal 522 being coupled to receive the ON pulses as shown.

After the readout period, the row including pixel circuit 410 begins an idle period as shown in the timing diagrams.

Figure 5C:
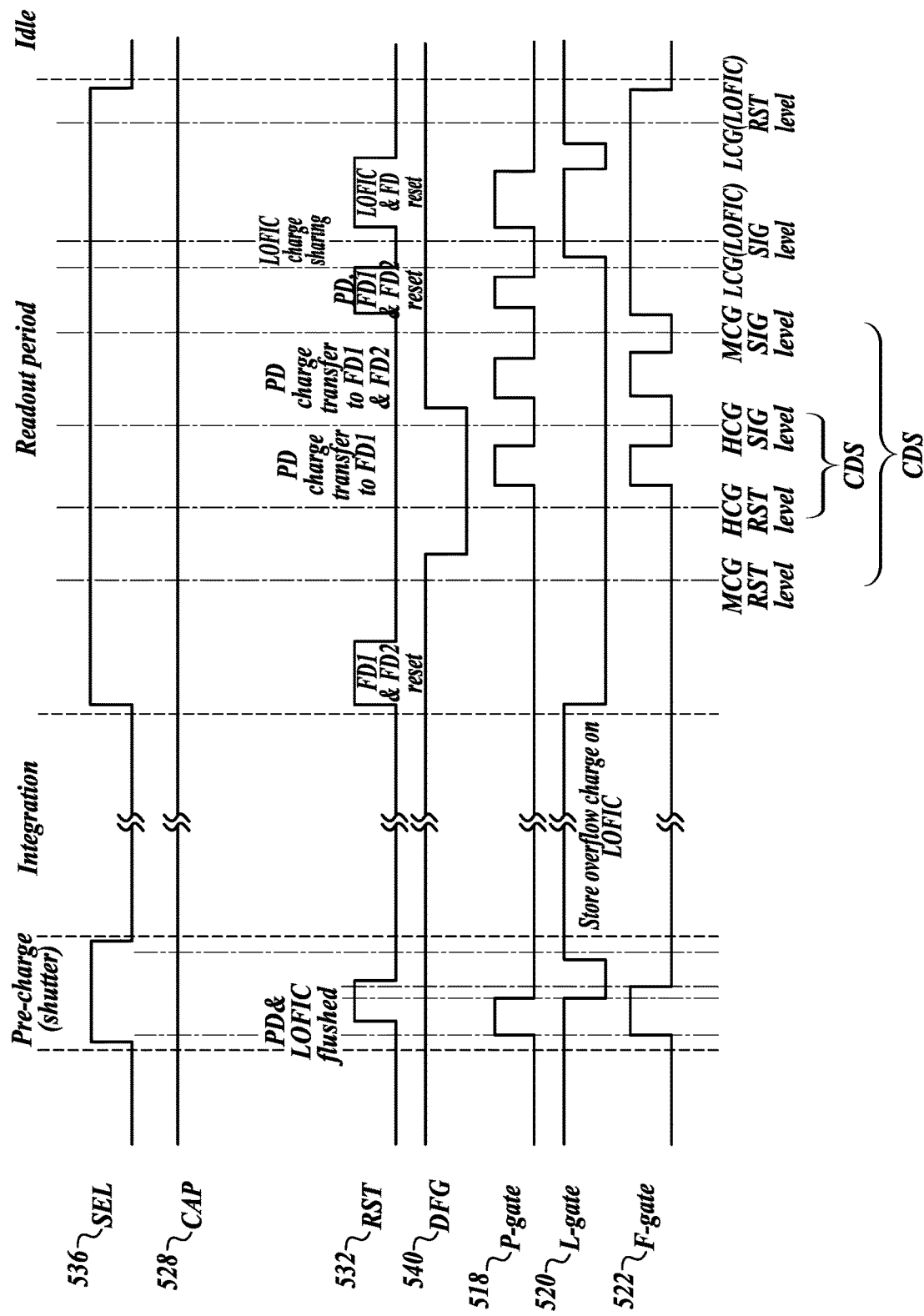

As mentioned, the example depicted in FIG. 5B above addresses the disadvantage of dark current from overflow capacitor electrode junctions by modulating the overflow capacitor 426 electrodes with capacitor signal 528 pulsing where low conversion gain (LCG) readouts are used to read out photodiode charges plus overflow capacitor charges. The example timing diagram depicted in FIG. 5C illustrates another pixel timing example in which low conversion gain (LCG) readouts only read out overflow capacitor images charges that are separated from photodiode image charges. In the depicted example, it is noted that the overflow capacitor 426 electrodes are not modulated with the capacitor signal 528, and that the capacitor signal 528, and that the capacitor signal 528 therefore remains at a pulse ON potential level throughout the timing diagram shown of FIG. 5C.

As shown in the example depicted in FIG. 5C, processing may begin with a pre-charge (shutter) period, which may occur for instance to initialize the pixel cell prior to an integration period. During the pre-charge period, the select signal 536, the reset signal 532, the dual floating diffusion gate (DFG) signal 540, the P gate signal 518, the L gate signal 520, and the F gate signal 522 all receive ON pulses as shown, which flush the photodiode 414 and the overflow capacitor (LOFIC) 426 of charge.

After the pre-charge period, an integration period may occur during which image charge is generated in the photodiode 414 in response to incident light. As shown in the example depicted in FIG. 5C, the select signal 536, the reset signal 532, the P gate signal 518, and the F gate signal 522 are all coupled to receive OFF pulses, and the DFG signal 540 and the L gate signal 520 are coupled to receive an ON pulse as shown. During the integration period, the excess or overflow image charge that is generated in the photodiode 414 that is generated in response to the incident light is configured to leak from the photodiode 414 into the conduction gate channel 424 and be transferred to the overflow capacitor 426.

After the integration period, the readout period begins with the first floating diffusion 430 and the second floating diffusion 442 being coupled to be reset to flush out undesired charge in response to the P gate signal 518, the L gate signal 520, and the F gate signal 522 being coupled to receive OFF pulses, and the select signal 536, the reset signal 532, and the DFG signal 540 being coupled to receive ON pulses as shown. It is appreciated that the first floating diffusion 430 and the second floating diffusion 442 are reset to the reset level without affecting the overflow charge in the overflow capacitor 426.

After the first floating diffusion 430 and the second floating diffusion 442 are reset, the reset level from the first floating diffusion 430 and the second floating diffusion 442 may be read out through the source follower transistor 434 and the row select transistor 436 in response to the reset signal 532, the P gate signal 518, the L gate signal 520, and the F gate signal 522 being coupled to receive OFF pulses, and the select signal 536 and the DFG signal 540 being coupled to receive ON pulses to provide a medium conversion gain (MCG) reset level for correlated double sampling (CDS) determination as shown.

Next, as shown in the depicted example, a high conversion gain (HCG) reset level may be read out for correlated double sampling (CDS) determination in response to the reset signal 532, the DFG signal 540, the P gate signal 518, the L gate signal 520, and the F gate signal 522 being coupled to receive OFF pulses, and the select signal 536 being coupled to receive the ON pulse as shown.

Then, the image charge is transferred to the first floating diffusion 430 from the photodiode 414 in response to the reset signal 532, the DFG signal 540, and the L gate signal 520 being coupled to receive OFF pulses, and the select signal 536, the P gate signal 518, and the F gate signal 522 being coupled to receive ON pulses as shown. It is appreciated that the image charge from the photodiode 414 is transferred to the first floating diffusion 430 through the P gate 418 and the F gate 422 without flowing to the overflow capacitor 426.

Next, a high conversion gain (HCG) signal level may be read out for correlated double sampling (CDS) determination in response to the reset signal 532, the DFG signal 540, the P gate signal 518, the L gate signal 520, and the F gate signal 522 being coupled to receive OFF pulses, and the select signal 536 being coupled to receive the ON pulse as shown.

Then, additional image charge from the photodiode 414 is transferred to both the first floating diffusion 430 and the second floating diffusion 442 in response to the reset signal 532 and the L gate signal 520 being coupled to receive OFF pulses, and the select signal 536, the DFG signal 540, the P gate signal 518, and the F gate signal 522 being coupled to receive ON pulses as shown. It is appreciated that the image charge from the photodiode 414 is transferred to the first floating diffusion 430 and the second floating diffusion 442 through the P gate 418, the F gate 422, and the DFG transistor 440 without flowing to the overflow capacitor 426.

Next, a medium conversion gain (MCG) signal level (e.g., including charge read out from both the first floating diffusion 430 and the second floating diffusion 442) may be read out for correlated double sampling (CDS) determination in response to the reset signal 532, the P gate signal 518, the L gate signal 520, and the F gate signal 522 being coupled to receive OFF pulses, and the select signal 536 and the DFG signal 540 being coupled to receive the ON pulses as shown.

Then, the photodiode 414, the first floating diffusion 430, and the second floating diffusion 442 may be reset in response to the select signal 536, the reset signal 532, the DFG signal 540, the P gate signal 518, and the F gate signal 522 being coupled to receive the ON pulses, and the L gate signal 520 being coupled to receive OFF pulse as shown.

Then, the overflow image charge in the overflow capacitor 426 may be dumped into the first floating diffusion 430 and the second floating diffusion 442 in response to the reset signal 532 and the P gate signal 518 being coupled to receive OFF pulses, and the select signal 536, the DFG signal 540, the L gate signal 520, and the F gate signal 522 being coupled to receive the ON pulses as shown.

Next, a low conversion gain (LCG) signal level (e.g., including charge read out from the overflow capacitor 426, the first floating diffusion 430, and the second floating diffusion 442) may be read out in response to the reset signal 532 and the P gate signal 518 being coupled to receive OFF pulses, and the select signal 536, the DFG signal 540, the L gate signal 520, and the F gate signal 522 being coupled to receive the ON pulses as shown.

Then, the overflow capacitor 426, the first floating diffusion 430, and the second floating diffusion 442 are all coupled to be reset to flush out charge in response to the select signal 536, the reset signal 532, the DFG signal 540, the P gate signal 518, the L gate signal 520, and the F gate signal 522 all being coupled to receive ON pulses as shown. Thus, it is appreciated that all image charge is drained from the pixel circuit 410 via the DFG transistor 440 and the reset transistor 432 as a result.

Next, a low conversion gain (LCG) reset level may then be read out in response to the reset signal 532 and the P gate signal 518 being coupled to receive OFF pulses, and the select signal 536, the DFG signal 540, the L gate signal 520, and the F gate signal 522 being coupled to receive the ON pulses as shown.

After the readout period, the row including pixel circuit 410 begins an idle period as shown in the timing diagrams.

Figure 5D:
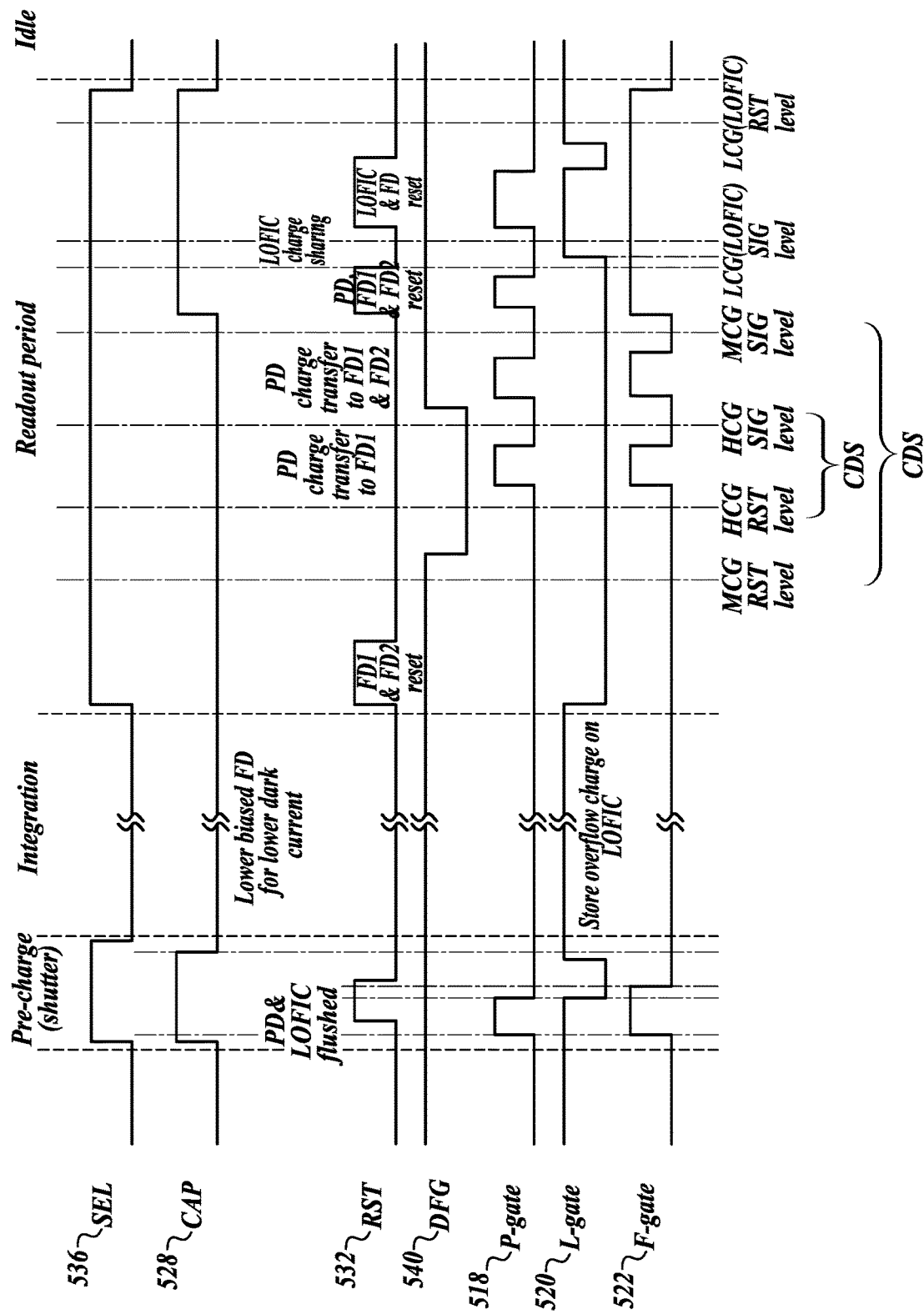

The example timing diagram depicted in FIG. 5D illustrates another example in which the potential of overflow capacitor 426 electrodes is modulated with appropriate capacitor signal (CAP) 528 pulsing. As shown in the example depicted in FIG. 5D, processing may begin with a pre-charge (shutter) period, which may occur for instance to initialize the pixel cell prior to an integration period. During the pre-charge period, the select signal 536, the reset signal 532, the dual floating diffusion gate (DFG) signal 540, the P gate signal 518, the L gate signal 520, and the F gate signal 522 all receive ON pulses and the capacitor signal 528 receives a pulse ON signal as shown, which flush the photodiode 414 and the overflow capacitor (LOFIC) 426 of charge. It is noted that in the example depicted in FIG. 5D, the pulses of the capacitor signal 528 and the F gate signal 522 are synchronized.

After the pre-charge period, an integration period may occur during which image charge is generated in the photodiode 414 in response to incident light. As shown in the example depicted in FIG. 5D, the select signal 536, the reset signal 532, the P gate signal 518, and the F gate signal 322 are all coupled to receive OFF pulses, the capacitor signal 528 receives a pulse OFF signal, and the DFG signal 540 and the L gate signal 520 are coupled to receive an ON pulse as shown. During the integration period, the excess or overflow image charge that is generated in the photodiode 414 that is generated in response to the incident light is configured to leak from the photodiode 414 into the conduction gate channel 424 and be transferred to the overflow capacitor 426.

After the integration period, the readout period begins with the first floating diffusion 430 and the second floating diffusion 442 being coupled to be reset to flush out undesired charge in response to the P gate signal 518, the L gate signal 520, and the F gate signal 522 being coupled to receive OFF pulses, the capacitor signal 528 receiving the pulse OFF signal, and the select signal 536, the reset signal 532, and the DFG signal 540 being coupled to receive ON pulses as shown. It is appreciated that the first floating diffusion 430 and the second floating diffusion 442 are reset to the reset level without affecting the overflow charge in the overflow capacitor 426.

After the first floating diffusion 430 and the second floating diffusion 442 are reset, the reset level from the first floating diffusion 430 and the second floating diffusion 442 may be read out through the source follower transistor 434 and the row select transistor 436 in response to the reset signal 532, the P gate signal 518, the L gate signal 520, and the F gate signal 522 being coupled to receive OFF pulses, the capacitor signal 528 receiving a pulse OFF signal, and the select signal 536 and the DFG signal 540 being coupled to receive ON pulses to provide a medium conversion gain (MCG) reset level for correlated double sampling (CDS) determination as shown.

Next, as shown in the depicted example, a high conversion gain (HCG) reset level may be read out for correlated double sampling (CDS) determination in response to the reset signal 532, the DFG signal 540, the P gate signal 518, the L gate signal 520, and the F gate signal 522 being coupled to receive OFF pulses, the capacitor signal 528 receiving a pulse OFF signal, and the select signal 536 being coupled to receive the ON pulse as shown.

Then, the image charge is transferred to the first floating diffusion 430 from the photodiode 414 in response to the reset signal 532, the DFG signal 540, and the L gate signal 520 being coupled to receive OFF pulses, the capacitor signal 528 receiving a pulse OFF signal, and the select signal 536, the P gate signal 518, and the F gate signal 522 being coupled to receive ON pulses as shown. It is appreciated that the image charge from the photodiode 414 is transferred to the first floating diffusion 430 through the P gate 418 and the F gate 422 without flowing to the overflow capacitor 426.

Next, a high conversion gain (HCG) signal level may be read out for correlated double sampling (CDS) determination in response to the reset signal 532, the DFG signal 540, the P gate signal 518, the L gate signal 520, and the F gate signal 522 being coupled to receive OFF pulses, the capacitor signal 528 receiving a pulse OFF signal, and the select signal 536 being coupled to receive the ON pulse as shown.

Then, additional image charge from the photodiode 414 is transferred to both the first floating diffusion 430 and the second floating diffusion 442 in response to the reset signal 532 and the L gate signal 520 being coupled to receive OFF pulses, the capacitor signal 528 receiving a pulse OFF signal, and the select signal 536, the DFG signal 540, the P gate signal 518, and the F gate signal 522 being coupled to receive ON pulses as shown. It is appreciated that the image charge from the photodiode 414 is transferred to the first floating diffusion 430 and the second floating diffusion 442 through the P gate 418, the F gate 422, and the DFG transistor 440 without flowing to the overflow capacitor 426.

Next, a medium conversion gain (MCG) signal level (e.g., including charge read out from both the first floating diffusion 430 and the second floating diffusion 442) may be read out for correlated double sampling (CDS) determination in response to the reset signal 532, the P gate signal 518, the L gate signal 520, and the F gate signal 522 being coupled to receive OFF pulses, the capacitor signal 528 receiving a pulse OFF signal, and the select signal 536 and the DFG signal 540 being coupled to receive the ON pulses as shown.

Then, the photodiode 414, the first floating diffusion 430, and the second floating diffusion 442 may be reset in response to the select signal 536, the reset signal 532, the DFG signal 540, the P gate signal 518, and the F gate signal 522 being coupled to receive the ON pulses, the capacitor signal 528 receiving a pulse ON signal, and the L gate signal 520 being coupled to receive OFF pulse as shown.

Then, the overflow image charge in the overflow capacitor 426 may be dumped into the first floating diffusion 430 and the second floating diffusion 442 in response to the reset signal 532 and the P gate signal 518 being coupled to receive OFF pulses, the capacitor signal 528 receiving a pulse ON signal, and the select signal 536, the DFG signal 540, the L gate signal 520, and the F gate signal 522 being coupled to receive the ON pulses as shown.

Next, a low conversion gain (LCG) signal level (e.g., including charge read out from the overflow capacitor 426, the first floating diffusion 430, and the second floating diffusion 442) may be read out in response to the reset signal 532 and the P gate signal 518 being coupled to receive OFF pulses, the capacitor signal 528 receiving the pulse ON signal, and the select signal 536, the DFG signal 540, the L gate signal 520, and the F gate signal 522 being coupled to receive the ON pulses as shown.

Then, the overflow capacitor 426, the first floating diffusion 430, and the second floating diffusion 442 are all coupled to be reset to flush out charge in response to the select signal 536, the reset signal 532, the DFG signal 540, the P gate signal 518, the L gate signal 520, and the F gate signal 522 all being coupled to receive ON pulses, and the capacitor signal 528 receiving a pulse ON signal as shown. Thus, it is appreciated that all image charge is drained from the pixel circuit 410 via the DFG transistor 440 and the reset transistor 432 as a result.

Next, a low conversion gain (LCG) reset level may then be read out in response to the reset signal 532 and the P gate signal 518 being coupled to receive OFF pulses, the capacitor signal 528 receiving a pulse ON signal, and the select signal 536, the DFG signal 540, the L gate signal 520, and the F gate signal 522 being coupled to receive the ON pulses as shown.

After the readout period, the row including pixel circuit 410 begins an idle period as shown in the timing diagrams. In the example timing diagram depicted in FIG. 5D, it is noted that the pulses of the capacitor signal 528 and the F gate signal 522 are synchronized between the read out of the medium conversion gain (MCG) signal level and the commencement of the idle period as shown.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit, comprising:
    a photodiode disposed in a semiconductor material layer;
    a floating diffusion disposed in the semiconductor material layer;
    a reset transistor coupled between a voltage supply and the floating diffusion;
    an overflow capacitor; and
    a multi-gate transfer block coupled to the photodiode, the floating diffusion, and the overflow capacitor, wherein the multi-gate transfer block comprises:
        a conduction gate channel disposed in the semiconductor material layer; and
        a plurality of gates disposed proximate to the single conduction gate channel region, wherein the conduction gate channel is a single region shared among the plurality of gates,
    wherein overflow image charge generated in the photodiode in response to incident light during an integration period is configured to leak from the photodiode into the conduction gate channel and be transferred to the overflow capacitor in response to a first gate of the plurality of gates, which is coupled between the photodiode and the conduction gate channel, receiving a first gate OFF signal and a second gate of the plurality of gates, which is coupled between the conduction gate channel and the overflow capacitor, receiving a second gate ON signal,
    wherein the plurality of gates further includes a third gate coupled between the conduction gate channel and the floating diffusion,
    wherein image charge generated in the photodiode in response to the incident light is configured to be transferred from the photodiode into the conduction gate channel and be transferred to the floating diffusion in response to the first gate receiving a first gate ON signal, the second gate receiving a second gate OFF signal, the third gate receiving a third gate ON signal, and the reset transistor receiving a reset OFF signal.

2. The pixel circuit of claim 1, wherein the conduction gate channel is devoid of junctions between the first gate, the second gate, and the third gate.

3. The pixel circuit of claim 1, wherein the photodiode, the overflow capacitor, and the floating diffusion and configured to be selectively coupled together through the multi-gate transfer block via charge coupling among the first gate, the second gate, and the third gate through the conduction gate channel.

4. The pixel circuit of claim 1, wherein the overflow image charge is further configured to leak from the photodiode into the conduction gate channel and be transferred to the overflow capacitor during the integration period in response to the third gate receiving a third gate OFF signal.

5. The pixel circuit of claim 1, wherein the floating diffusion is coupled to be reset in response to the reset transistor receiving a reset ON signal, the first gate receiving the first gate OFF signal, the second gate receiving a second gate OFF signal, and the third gate receiving a third gate OFF signal.

6. The pixel circuit of claim 1, further comprising a source follower transistor having a gate coupled to the floating diffusion.

7. The pixel circuit of claim 6, wherein the overflow image charge in the overflow capacitor and the image charge in the floating diffusion are configured to be shared to the source follower transistor in response the first gate receiving the first gate OFF signal, the second gate receiving a second gate ON signal, the third gate receiving a third gate ON signal, and the reset transistor receiving the reset OFF signal.

8. The pixel circuit of claim 6, wherein the image charge in the floating diffusion is configured to be readout from the pixel circuit through the source follower transistor in response the first gate receiving the first gate OFF signal, the second gate receiving the second gate OFF signal, the third gate receiving a third gate OFF signal, and the reset transistor receiving the reset OFF signal.

9. The pixel circuit of claim 6, wherein the image charge in the floating diffusion and the overflow capacitor are configured to be readout from the pixel circuit through the source follower transistor in response the first gate receiving the first gate OFF signal, the second gate receiving the second gate ON signal, the third gate receiving a third gate ON signal, and the reset transistor receiving the reset OFF signal.

10. The pixel circuit of claim 1, wherein the overflow image charge in the overflow capacitor and the image charge in the floating diffusion are configured to be reset in response to the first gate receiving the first gate OFF signal, the second gate receiving a second gate ON signal, the third gate receiving a third gate ON signal, and the reset transistor receiving a reset ON signal.

11. The pixel circuit of claim 1, wherein the overflow capacitor is a lateral overflow integration capacitor (LO-FIC).

12. The pixel circuit of claim 1, wherein the floating diffusion is a first floating diffusion, wherein the pixel circuit further comprises:
 a second floating diffusion disposed in the semiconductor material layer and coupled between the reset transistor and the first floating diffusion;
 a second capacitor coupled to the second floating diffusion; and
 a dual floating diffusion gate (DFG) transistor coupled between the second floating diffusion and the first floating diffusion.

13. The pixel circuit of claim 12, wherein the first floating diffusion and the second floating diffusion are coupled to be reset in response to the reset transistor receiving a reset ON signal, the DFG transistor receiving a DFG ON signal, the first gate receiving the first gate OFF signal, the second gate receiving a second gate OFF signal, and the third gate receiving a third gate OFF signal.

14. The pixel circuit of claim 12, wherein image charge generated in the photodiode in response to the incident light is configured to be transferred from the photodiode into the conduction gate channel and be transferred to the first floating diffusion in response to the first gate receiving a first gate ON signal, the second gate receiving a second gate OFF signal, the third gate receiving a third gate ON signal, the reset transistor receiving a reset OFF signal, and the DFG transistor receiving a DFG OFF signal.

15. The pixel circuit of claim 12, wherein image charge generated in the photodiode in response to the incident light is configured to be transferred from the photodiode into the conduction gate channel, be transferred to the first floating diffusion, and be transferred to the second floating diffusion in response to the first gate receiving a first gate ON signal, the second gate receiving a second gate OFF signal, the third gate receiving a third gate ON signal, the reset transistor receiving a reset OFF signal, and the DFG transistor receiving a DFG ON signal.

16. The pixel circuit of claim 15, wherein the overflow image charge in the overflow capacitor, and the image charge in the first floating diffusion, and the image charge in the second floating diffusion are configured to be readout from the pixel circuit in response to the first gate receiving the first gate OFF signal, the second gate receiving the second gate ON signal, the third gate receiving the third gate ON signal, the reset transistor receiving the reset OFF signal, and the DFG transistor receiving a DFG ON signal.

17. The pixel circuit of claim 12, wherein the photodiode, the overflow image charge in the overflow capacitor, the image charge in the first floating diffusion, and the image charge in the second floating diffusion are configured to be reset in response to the first gate receiving the first gate ON signal, the second gate receiving the second gate ON signal, the third gate receiving the third gate ON signal, the reset transistor receiving a reset ON signal, and the DFG transistor receiving a DFG ON signal.

18. The pixel circuit of claim 12, wherein the overflow capacitor includes a first end coupled to the second gate and a second end coupled to receive a capacitor signal.

19. The pixel circuit of claim 18, wherein the first floating diffusion and the second floating diffusion are coupled to be reset in response to the overflow capacitor receiving a pulse ON capacitor signal, the reset transistor receiving a reset ON signal, the DFG transistor receiving a DFG ON signal, the first gate receiving the first gate OFF signal, the second gate receiving a second gate OFF signal, and the third gate receiving a third gate OFF signal.

20. The pixel circuit of claim 18, wherein image charge generated in the photodiode in response to the incident light is configured to be transferred from the photodiode into the conduction gate channel and be transferred to the first floating diffusion in response to the overflow capacitor receiving a pulse OFF capacitor signal, the first gate receiving a first gate ON signal, the second gate receiving a second gate OFF signal, the third gate receiving a third gate ON signal, the reset transistor receiving a reset OFF signal, and the DFG transistor receiving a DFG OFF signal.

21. The pixel circuit of claim 18, wherein image charge generated in the photodiode in response to the incident light is configured to be transferred from the photodiode into the conduction gate channel, be transferred to the first floating diffusion, and be transferred to the second floating diffusion in response to the overflow capacitor receiving a pulse OFF capacitor signal, the first gate receiving a first gate ON signal, the second gate receiving a second gate OFF signal, the third gate receiving a third gate ON signal, the reset transistor receiving a reset OFF signal, and the DFG transistor receiving a DFG ON signal.

22. The pixel circuit of claim 21, wherein the overflow image charge in the overflow capacitor, and the image charge in the first floating diffusion, and the image charge in the second floating diffusion are configured to be readout from the pixel circuit in response to the overflow capacitor receiving a pulse ON capacitor signal, the first gate receiving a first gate OFF signal, the second gate receiving a second gate ON signal, the third gate receiving a third gate ON signal, the reset transistor receiving a reset OFF signal, and the DFG transistor receiving a DFG ON signal.

23. The pixel circuit of claim 18, wherein the photodiode, the overflow image charge in the overflow capacitor, the image charge in the first floating diffusion, and the image charge in the second floating diffusion are configured to be reset in response to the overflow capacitor receiving a pulse ON capacitor signal, the first gate receiving the first gate ON signal, the second gate receiving the second gate ON signal, the third gate receiving the third gate ON signal, the reset transistor receiving a reset ON signal, and the DFG transistor receiving a DFG ON signal.

24. The pixel circuit of claim 18, wherein the first floating diffusion and the second floating diffusion are coupled to be reset in response to the overflow capacitor receiving a pulse OFF capacitor signal, the reset transistor receiving a reset ON signal, the DFG transistor receiving a DFG ON signal, the first gate receiving the first gate OFF signal, the second gate receiving a second gate OFF signal, and the third gate receiving a third gate OFF signal.

25. The pixel circuit of claim 18, wherein the photodiode, the image charge in the first floating diffusion, and the image charge in the second floating diffusion are configured to be reset in response to the overflow capacitor receiving a pulse ON capacitor signal, the first gate receiving the first gate ON signal, the second gate receiving the second gate OFF signal, the third gate receiving the third gate ON signal, the reset transistor receiving a reset ON signal, and the DFG transistor receiving a DFG ON signal.

26. The pixel circuit of claim 12, wherein the photodiode, the image charge in the first floating diffusion, and the image charge in the second floating diffusion are configured to be reset in response to the first gate receiving the first gate ON signal, the second gate receiving the second gate OFF signal, the third gate receiving the third gate ON signal, the reset transistor receiving a reset ON signal, and the DFG transistor receiving a DFG ON signal.

27. An imaging system, comprising:
a pixel array including a plurality of pixel circuits arranged in a plurality of rows and a plurality of columns, wherein each one of the pixel circuits includes:
a photodiode disposed in a semiconductor material layer;
a floating diffusion disposed in a semiconductor material layer;
a reset transistor coupled between a voltage supply and the floating diffusion;
an overflow capacitor; and
a multi-gate transfer block coupled to the photodiode, the floating diffusion, and the overflow capacitor, wherein the multi-gate transfer block comprises:
a conduction gate channel disposed in the semiconductor material layer; and
a plurality of gates disposed proximate to the single conduction gate channel region, wherein the conduction gate channel is a single region shared among the plurality of gates,
wherein overflow image charge generated in the photodiode in response to incident light during an integration period is configured to leak from the photodiode into the conduction gate channel and be transferred to the overflow capacitor in response to a first gate of the plurality of gates, which is coupled between the photodiode and the conduction gate channel, receiving a first gate OFF signal and a second gate of the plurality of gates, which is coupled between the conduction gate channel and the overflow capacitor, receiving a second gate ON signal,
wherein the plurality of gates further includes a third gate coupled between the conduction gate channel and the floating diffusion,
wherein image charge generated in the photodiode in response to the incident light is configured to be transferred from the photodiode into the conduction gate channel and be transferred to the floating diffusion in response to the first gate receiving a first gate ON signal, the second gate receiving a second gate OFF signal, the third gate receiving a third gate ON signal, and the reset transistor receiving a reset OFF signal;
a control circuitry coupled to the pixel array to control operation of the pixel array; and
a readout circuitry coupled to the pixel array to read out image data from the plurality of pixel cells.

28. The imaging system of claim 27, further comprising function logic coupled to the readout circuitry to store the image data from each one of the plurality of pixel cells.

29. The imaging system of claim 27, wherein the overflow image charge is further configured to overflow from the photodiode into the conduction gate channel and be transferred to the overflow capacitor during the integration period in response to the third gate receiving a third gate OFF signal.

30. The imaging system of claim 27, wherein the floating diffusion is coupled to be reset in response to the reset transistor receiving a reset ON signal, the first gate receiving the first gate OFF signal, the second gate receiving a second gate OFF signal, and the third gate receiving a third gate OFF signal.

31. The imaging system of claim 27, further comprising:
a source follower transistor having a gate coupled to the floating diffusion; and
a row select transistor coupled to the source follower transistor.

32. The imaging system of claim 31, wherein the overflow image charge in the overflow capacitor and the image charge in the floating diffusion are configured to be shared to the source follower transistor in response the first gate receiving the first gate OFF signal, the second gate receiving a second gate ON signal, the third gate receiving a third gate ON signal, and the reset transistor receiving the reset OFF signal.

33. The imaging system of claim 31, wherein the image charge in the floating diffusion is configured to be readout from the pixel circuit through the source follower transistor in response the first gate receiving the first gate OFF signal, the second gate receiving the second gate OFF signal, the third gate receiving a third gate OFF signal, and the reset transistor receiving the reset OFF signal.

34. The imaging system of claim 31, wherein the image charge in the floating diffusion and the overflow capacitor are configured to be readout from the pixel circuit through the source follower transistor in response the first gate receiving the first gate OFF signal, the second gate receiving the second gate ON signal, the third gate receiving a third gate ON signal, and the reset transistor receiving the reset OFF signal.

35. The imaging system of claim 27, wherein the overflow image charge in the overflow capacitor and the image charge in the floating diffusion are configured to be reset in response to the first gate receiving the first gate OFF signal, the second gate receiving a second gate ON signal, the third gate receiving a third gate ON signal, and the reset transistor receiving a reset ON signal.

36. The imaging system of claim 27, wherein the floating diffusion is a first floating diffusion, wherein the pixel circuit further comprises:
a second floating diffusion disposed in the semiconductor material layer and coupled between the reset transistor and the first floating diffusion;
a second capacitor coupled to the second floating diffusion; and
a dual floating diffusion gate (DFG) transistor coupled between the second floating diffusion and the first floating diffusion.

37. The imaging system of claim 36, wherein the overflow capacitor includes a first end coupled to the second gate and a second end coupled to receive a capacitor signal.

* * * * *